US 6,699,744 B2

(12) United States Patent
Kwak et al.

(10) Patent No.: US 6,699,744 B2
(45) Date of Patent: Mar. 2, 2004

(54) METHOD OF FORMING A MOS TRANSISTOR OF A SEMICONDUCTOR DEVICE

(75) Inventors: Noh-yeal Kwak, Icheon-shi (KR); Sang-wook Park, Gwangjin-gu (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 50 days.

(21) Appl. No.: 10/172,842

(22) Filed: Jun. 17, 2002

(65) Prior Publication Data

US 2002/0197837 A1 Dec. 26, 2002

(30) Foreign Application Priority Data

Jun. 19, 2001 (KR) ........................................ 2001-34792

(51) Int. Cl.⁷ .......................................... H01L 21/8238
(52) U.S. Cl. ........................................ 438/218; 438/199
(58) Field of Search ................................ 438/199, 217, 438/218

(56) References Cited

U.S. PATENT DOCUMENTS

| 5,308,780 A | 5/1994 | Chou et al. ................... 437/44 |
| 5,565,700 A | 10/1996 | Chou et al. .................. 257/408 |
| 6,090,653 A | 7/2000 | Wu .............................. 438/231 |
| 6,146,970 A | 11/2000 | Witek et al. ................. 438/424 |

Primary Examiner—John F. Niebling
Assistant Examiner—Christopher Lattin
(74) Attorney, Agent, or Firm—Marshall, Gerstein & Borun LLP

(57) ABSTRACT

The disclosure relates to a method of forming a MOS transistor of a semiconductor device and, more particularly, to a method of forming a PMOS transistor of a semiconductor device that minimizes temporary reinforcement and diffusion of dopants for controlling a threshold voltage and dopants for forming a gate electrode due to the selective oxidization of side walls of a conductive layer even though a post heat process is performed at a low temperature by implanting inert ions into the entire semiconductor substrate having a gate pattern including a conductive layer and a metal layer. Thus, the conductive layer and the metal layer are made to have different surface binding capacities to improve the characteristics, reliability and yield of the semiconductor device and to enable high integration of the semiconductor device.

31 Claims, 3 Drawing Sheets

METHOD OF FORMING A MOS TRANSISTOR OF A SEMICONDUCTOR DEVICE

BACKGROUND OF THE DISCLOSURE

1. Field of the Disclosure

The disclosure relates to a method for forming a MOS transistor of a semiconductor device and, more particularly, to a method of forming a PMOS transistor of a semiconductor device.

2. Description of the Related Art

With the high degree of integration of semiconductor devices, the line width of electrodes has become smaller, and electrodes having a higher signal processing speed are required. Therefore, for a word line and a bit line, a polycide structure (a double structure made by forming a metal layer using tungsten silicide or tungsten on doped polysilicon) is frequently employed.

In addition, in case of a buried channel type MOS transistor having a gate with such a tungsten polycide structure, as the size becomes smaller, there is a limit to the extent to which the channel length and internal operating voltage can be reduced, due to the degradation of the characteristics of the MOS transistor, such as a shift in the threshold voltage, an increase in punch-through voltage, and substrate threshold leakage according to a short channel effect.

FIG. 1 is a cross-sectional view illustrating a MOS formed by a conventional method for forming a MOS transistor of a semiconductor device. In the conventional art, as an alternative to the method for a buried channel described above, a gate oxide film 40 is formed on a semiconductor substrate 10 having a field oxide film 20 and threshold voltage ions are then implanted.

Then, an electrode with a polycide structure is formed by depositing a conductive layer 50 on the gate oxide film 40. Afterwards, in a process of forming a PMOS region and a NMOS region on the conductive layer 50, a gate electrode is formed by ion-implanting P into NMOS and ion-implanting B or $BF_2$ into PMOS, thereby forming a surface channel.

Then, a metal layer 60 is deposited on the conductive layer 50 and, after a gate patterning etching process is conducted by coating a photoresist film (not shown) thereon, a gate pattern 70 is formed.

At this time, due to the limitation on the selectivity of etching gases used in the gate patterning etching process, the side walls of the conductive layer 50 are excessively etched and lost as shown in "A".

Therefore, it is necessary to prevent the oxidization of the metal layer 60 of the gate pattern by conducting a high temperature heat process onto the gate pattern 70 and to compensate for the sidewalls of the conductive layer 50 lost from excessive etching by oxidizing only the conductive layer 50.

However, the gate electrode is formed by implanting p+ ions such as B or $BF_2$ onto the PMOS. Thus, in the high temperature heat process, the p+ ions in the gate electrode penetrate the semiconductor substrate through a lower gate oxide film due the bad thermal stability of the p+ ions. Accordingly, there occurs a problem that the threshold voltage of the PMOS transistor changes and the driving voltage is reduced.

In addition, there is another problem in that high-doping of the p+ ions is difficult because the p+ ions in the gate electrode are diffused into an upper metal layer.

SUMMARY OF THE DISCLOSURE

The disclosure provides a method for forming a PMOS transistor of a semiconductor device that minimizes the phenomenon of a temporary reinforcement and diffusion of dopants for controlling a threshold voltage and dopants for forming a gate electrode due to selective oxidization of the side walls of a conductive layer even though a post heat process is performed at a low temperature by implanting inert ions into the entire semiconductor substrate having a gate pattern formed of a conductive layer and a metal layer, thus making the conductive layer and the metal layer have different surface binding capacities.

The disclosure provides a method of forming a MOS transistor of a semiconductor device including the steps of: ion-implanting dopant for controlling the threshold voltage after forming a gate oxide film on the semiconductor substrate having a field oxide film; forming gate electrodes of NMOS and PMOS by ion-implanting n+ and p+ ions, respectively, after forming a conductive layer on an upper portion of the gate oxide film; forming a gate pattern by performing an etching process through a photoresist film as a mask after sequentially depositing a metal layer and the photoresist film on an upper portion of the conductive layer; performing an inclination ion-implanting process of inert ion on the semiconductor substrate having the gate pattern; and compensating for a loss of the conductive layer by performing a low temperature heat process on the gate pattern implanted with the inert ion and forming a tungsten nitride film on the surface of the metal layer.

The disclosed method minimizes the phenomenon of a temporary reinforcement and diffusion of dopants for controlling a threshold voltage and dopants for forming a gate electrode due to the selective oxidization of side walls of a conductive layer even though a post heat process is performed at a low temperature by implanting inert ions into the entire semiconductor substrate having a gate pattern consisting of a conductive layer and a metal layer and thus making the conductive layer and the metal layer have different surface binding capacities.

Moreover, $N_2$ dopants, i.e., the implanted inert ions, remain on the surface of the metal layer and are reacted with tungsten of the upper metal layer to thus form a tungsten nitride film on the surface of the metal layer, thereby enhancing the resistance of the junction region for a post process without conducting any additional steps on the upper portion of the metal layer and as a result, reducing a number of process steps.

BRIEF DESCRIPTION OF THE DRAWINGS

The foregoing objects, features and advantages of the disclosed method will become more apparent from the following detailed description when taken in conjunction with the accompanying drawings, in which.

DETAILED DESCRIPTION OF THE PREFERRED EMBODIMENT

A preferred embodiment of the disclosed method will be described with reference to the accompanying drawings.

Figure 1:
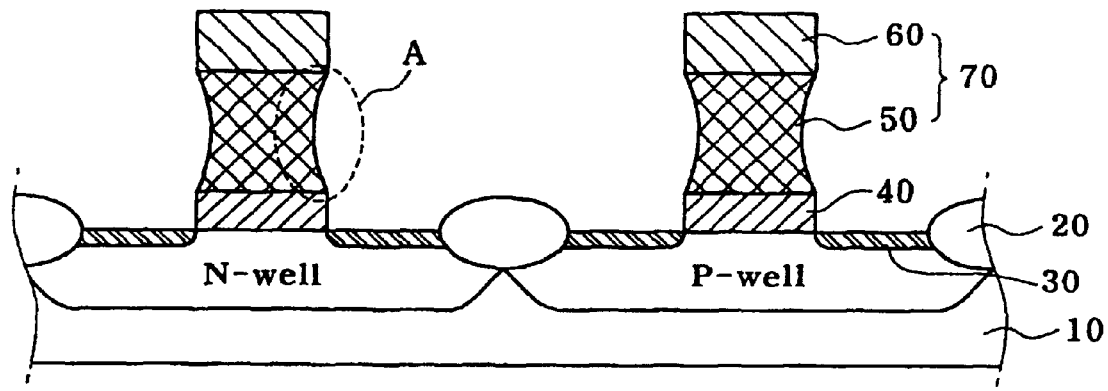
FIG. 1 is a cross-sectional view illustrating a MOS formed by a conventional method for forming a MOS transistor of a semiconductor device.
Figure 2A:
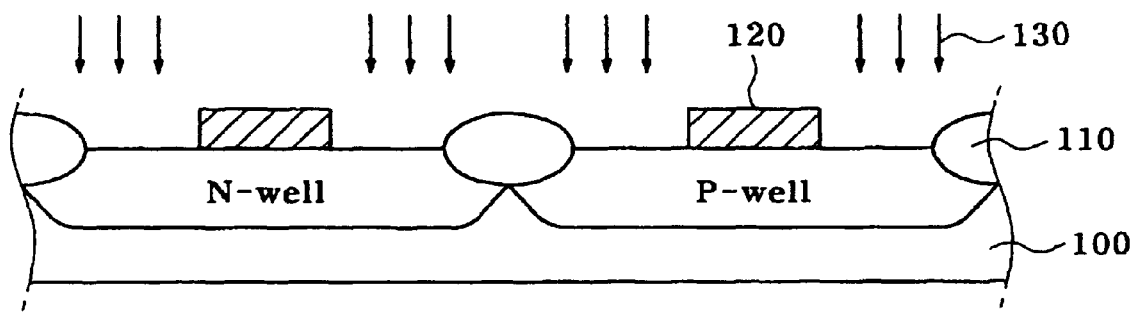
FIGS. 2a through 2e are a cross-sectional view sequentially illustrating a method for forming a MOS transistor.

As illustrated in FIG. 2a, a gate oxide film 120 is formed on a semiconductor substrate 100 having a field oxide film 110 formed by a shallow trench isolation process. Prior to depositing the gate oxide film 120, the surface of the semiconductor substrate 100 may be cleaned to remove impurities by using a solution of HF and SC-1 ($NH_4OH + H_2O_2 + H_2O$).

In addition, the gate oxide film 120 is formed by a wet oxidization process and a heat process. The wet oxidization process is conducted by using hydrogen and oxygen at a temperature of about 750° C. to about 800° C. and the heat process is conducted for about 20 minutes to about 30 minutes at a temperature of about 800° C. to about 950° C. under a nitrogen gas atmosphere, for thereby depositing the gate oxide film 120 at a thickness of about 40 Å to about 100 Å.

Then, dopants 130 for controlling a threshold voltage are ion-implanted into the upper portion of the gate oxide film 120 in order to form NMOS and PMOS transistors.

Figure 2B:
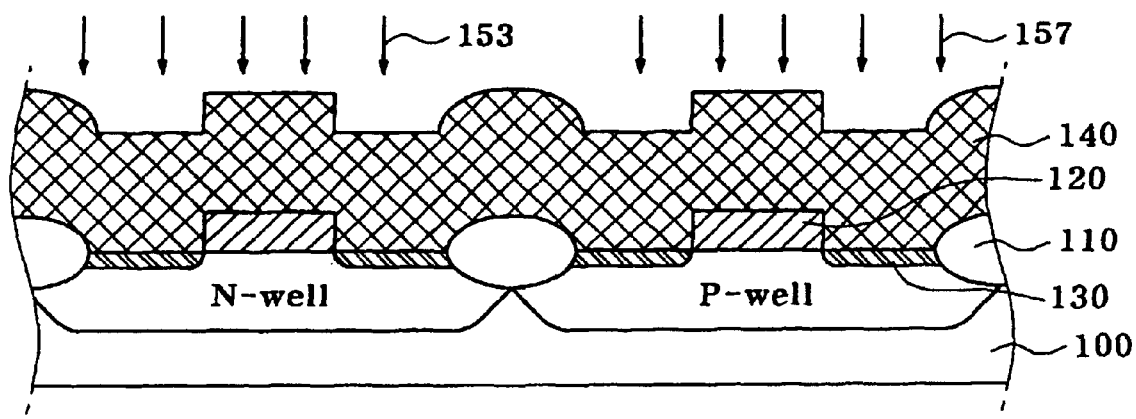

Continually, as illustrated in FIG. 2b, a conductive layer 140 is formed on the upper portion of the gate oxide film 120, and thereafter n+ ions 153 and p+ ions 157, dopants for forming a gate electrode on a NMOS region and a PMOS region, are respectively ion-implanted, for thereby forming NMOS and PMOS gate electrodes in the conductive layer 140.

At this time, the conductive layer 140 is deposited with a thickness of more than 700 Å by employing a low pressure chemical vapor deposition method at a temperature of about 510° C. to about 550° C. and a pressure of about 0.1 Torr to about 3 Torr by using silicon gas, e.g., $SiH_4$ and $Si_2H_6$.

In addition, when forming the NMOS gate electrode of the gate electrodes, P, i.e., n+ ions 153 of about 1E14 ion/cm² to about 1E16 ion/cm², are ion-implanted into the conductive layer 140 by applying ion implantation energy of about 10 KEV to about 30 KeV. When forming the PMOS gate electrode, B or $BF_2$, i.e., p+ ions 157 of about 1E14 ion/cm² to about 1E16 ion/cm², are ion-implanted into the conductive layer 140 by applying ion implantation energy of about 5 KeV to about 30 KeV.

At this time, when implanting the p+ ions 157 and the n+ ions 153, the implanted ions are diffused well into the conductive layer with an ion implantation inclination angle of 0°.

Figure 2C:
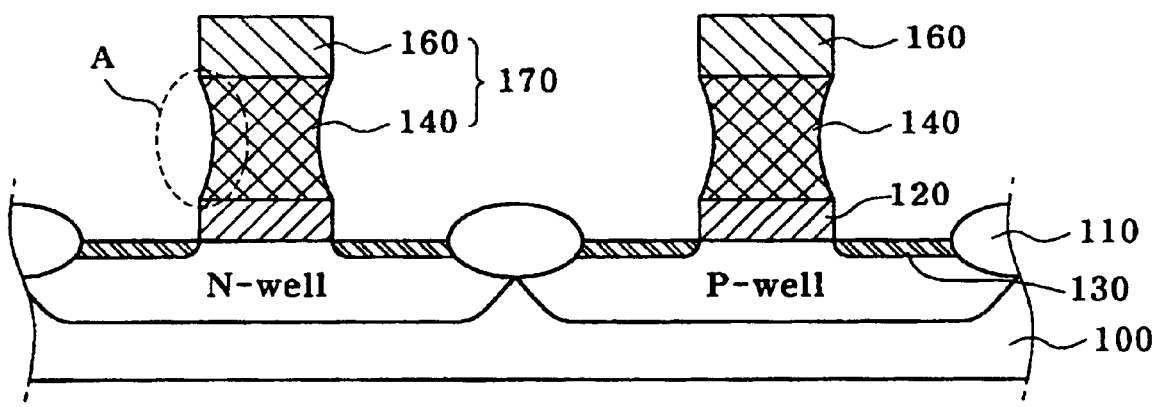

Then, as illustrated in FIG. 2c, a metal layer 160 and a photoresist film (not shown) are sequentially deposited on the upper portion of the conductive layer 140.

At this time, before depositing the metal layer 160, a diffusion preventive film (not shown) may be deposited in order to prevent silicon of the conductive layer 140 and tungsten of the metal layer 160 from being silidized at a junction area between the conductive layer 140 and the metal layer 160. The diffusion preventive film is deposited by a sputtering method using W, $N_2$ and Ar gases with a thickness of about 50 Å to about 100 Å.

In addition, the metal layer 160 is deposited using W and Ar gases with a thickness of about 500 Å to about 1000 Å by a sputtering method as an in-situ process with the diffusion preventive film deposition.

Continually, after depositing the photoresist film on the metal layer 160, a gate pattern 170 is formed by conducting a gate pattern etching process using a photo resist film (not shown) as a mask.

However, when forming and etching the gate pattern 170, the sidewalls of the conductive layer 140 are excessively etched due to the limitation on the selectivity of etching gases and thus are lost as shown in "A."

Figure 2D:
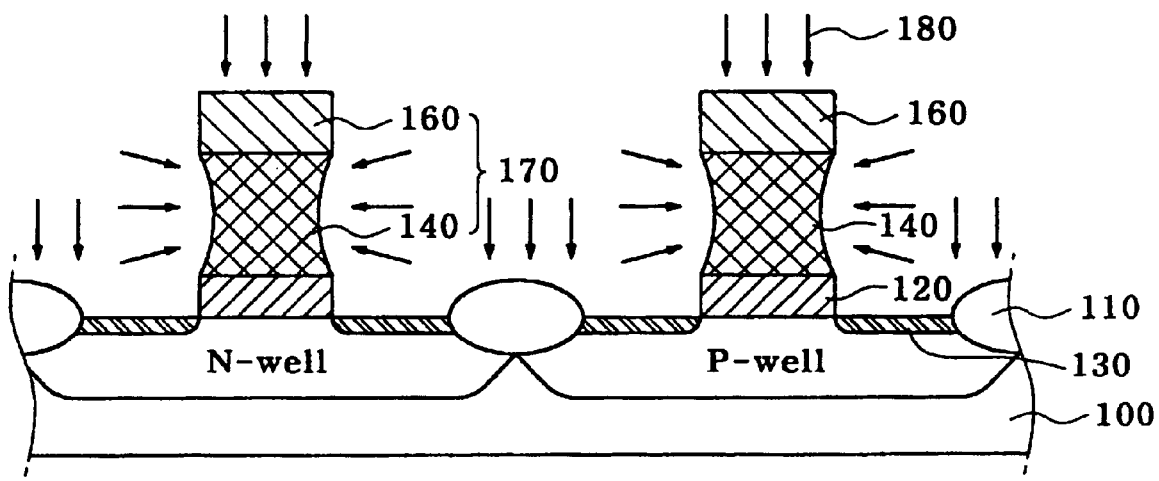

Then, as illustrated in FIG. 2d, the inclination ion implantation process of inert ions 180 is conducted on the semiconductor substrate having the gate pattern 170.

At this time, in the inclination ion implantation process, ion implantation energy of about 1 KeV to about 10 KeV is applied to the inert ions of about 5E13 ion/cm² to about 5E14 ion/cm², and the inert ions are implanted at an inclination of about 30° to about 60°. Ar and $N_2$ are used as the inert ions 180.

In addition, in the succeeding ion implantation for forming a junction region, the inert ions 180 implanted with a low energy act as a barrier layer and thereby easily make the junction area amorphous. Moreover, by making the conductive layer 140 and the metal layer 160 with different surface bonding capacities, the conductive layer 140 can be selectively oxidized by the succeeding low temperature heat process.

Figure 2E:
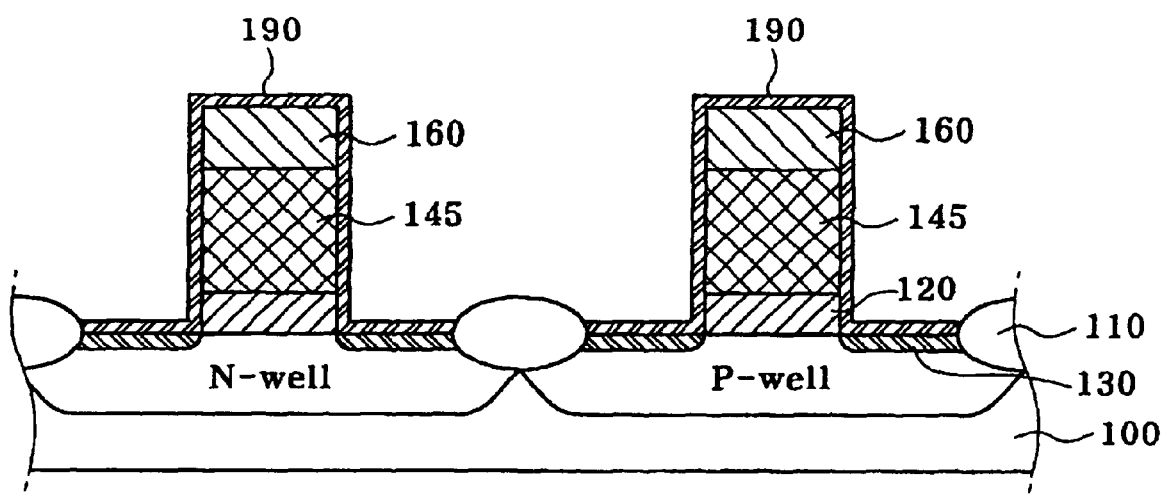

Continuously, as illustrated in FIG. 2e, the gate pattern 170 into which the inert ions 180 are implanted is chemically reacted with tungsten used as the metal layer 160 and $N_2$ used as the inert ions 180 ion-implanted into the surface of the metal layer 160 at a low temperature heat process, for thereby forming a tungsten nitride film 190. When forming and etching the gate pattern 170, the sidewalls of the conductive layer 140 excessively etched due to the limitation on the selectivity of used etching gases are selectively oxidized to thus compensate for the excessively etched sidewalls of the conductive layer 140.

Accordingly, as described above, the method for forming a PMOS transistor of a semiconductor device minimizes the phenomenon of a temporary reinforcement and diffusion of dopants for controlling a threshold voltage and dopants for forming a gate electrode due to the selective oxidization of side walls of a conductive layer even though a post heat process is performed at a low temperature by implanting inert ions into the entire semiconductor substrate having a gate pattern having a conductive layer and a metal layer and thus making a conductive layer and a metal layer have different surface binding capacities.

In addition, $N_2$ dopants, i.e., the implanted inert ions, prevent channeling of dopants for forming a junction at the ion implantation for forming a junction, to thereby form an effective shallow junction.

Moreover, $N_2$ dopants, i.e., the implanted inert ions, remain on the surface of the metal layer and are reacted with tungsten of the upper metal layer to thus form a tungsten nitride film on the surface of the metal layer, thereby enhancing the resistance of a junction region for a post process without conducting any additional process on the upper portion of the metal layer and resultantly reducing a number of process steps.

What is claimed is:

1. A method of forming a MOS transistor of a semiconductor device, comprising the steps of:

forming a gate oxide film on a semiconductor substrate having a field oxide film;

ion-implanting dopant for controlling a threshold voltage into the gate oxide film;

forming a conductive layer on an upper portion of the gate oxide film;

forming gate electrodes of NMOS and PMOS by ion-implanting n+ and p+ ions, respectively, into the conductive layer;

sequentially depositing a metal layer and a photoresist film onto an upper portion of the conductive layer;

forming a gate pattern by performing an etching process through the photoresist film as a mask;

performing an inclination ion-implanting process of inert ions on the semiconductor substrate having the gate pattern;

performing a low temperature heat process on the gate pattern implanted with the inert ion thereby compensating for a loss of the conductive layer; and forming a tungsten nitride film on the surface of the metal layer.

2. The method of claim 1, comprising forming the field oxide film by a shallow trench isolation process.

3. The method of claim 1, further comprising the step of performing a cleaning process before forming the gate oxide film.

4. The method of claim 3, comprising using HF and SC-1 solution as cleaning solution in the cleaning process.

5. The method of claim 1, comprising forming the gate oxide film by a wet-type oxidation process and a heat process.

6. The method of claim 5, comprising performing the wet-type oxidation process at a temperature of about 750° C. to about 800° C. by using hydrogen and oxygen.

7. The method of claim 5, comprising performing the heat process at a temperature of about 800° C. to about 950° C. in a nitrogen gas atmosphere for a duration of about 20 minutes to about 30 minutes.

8. The method of claim 1, comprising depositing the gate oxide film with a thickness of about 40 Å to about 100 Å.

9. The method of claim 1, wherein the conductive layer comprises polysilicon, and wherein the method comprises depositing the conductive layer with a thickness of more than 700 Å by a low pressure chemical vapor deposition method using silicon source gas.

10. The method of claim 9, comprising performing the low pressure chemical vapor deposition method at a temperature of about 510° C. to about 550° C. and a pressure of about 0.1 Torr to about 3 Torr.

11. The method of claim 1, comprising forming the NMOS gate electrode while applying ion implantation energy of about 10 KeV to about 30 KeV to n+ ions of about 1E14 ion/cm$^2$ to about ion/cm$^2$ 1E16 ion/cm$^2$, and implanting the n+ ions perpendicularly to the surface of the conductive layer.

12. The method of claim 1, wherein the n+ ions are P.

13. The method of claim 1, comprising forming the PMOS gate electrode which applies ion implantation energy of about 5 KeV to about 30 KeV to p+ ions of about 1E14 ion/cm$^2$ to about 1E16 ion/cm$^2$, and implanting the p+ ions perpendicularly to the surface of the conductive layer.

14. The method of claim 1, wherein the p+ ion is B or $BF_2$.

15. The method of claim 1, further comprising the step of forming a diffusion preventive film before depositing the metal layer.

16. The method of claim 15, wherein the diffusion preventive film is WNx and the method comprises depositing the diffusion preventive film by a sputtering method using W, $N_2$, and Ar gases with a thickness of about 50 Å to about 100 Å.

17. The method of claim 15, comprising depositing the diffusion preventive film in-situ.

18. The method of claim 1, comprising depositing the metal layer by a sputtering method using W and Ar gases with a thickness of about 500 Å to about 1000 Å.

19. The method of claim 1, comprising applying ion implantation energy of about 1 KeV to about 10 KeV to the inert ions of about 5E13 ion/cm$^2$ to about 5E14 ion/cm$^2$, and implanting the inert ions with an inclination angle of about 30° to about 60°, in the inclination ion implantation process.

20. The method of claim 1, wherein the inert ions are Ar and $N_2$.

21. A method of forming a MOS transistor of a semiconductor device comprising the steps of:

performing a cleaning process on a semiconductor substrate having a field oxide film;

forming a gate oxide film on the cleaned semiconductor substrate;

ion-implanting dopants for controlling a threshold voltage to the gate oxide film;

forming a conductive layer on an upper portion of the gate oxide film;

forming gate electrodes of NMOS and PMOS by ion-implanting n+ and p+ ions, respectively, to the conductive layer;

depositing a diffusion preventive film on the conductive layer;

sequentially depositing a metal layer and a photoresist film on the diffusion preventive film;

forming a gate pattern by performing an etching process through the photoresist film as a mask;

performing an inclination ion-implanting process of inert ions on the semiconductor substrate having the gate pattern;

performing a low temperature heat process on the gate pattern implanted with the inert ion thereby compensating for a loss of the conductive layer; and forming a tungsten nitride film on the surface of the metal layer.

22. The method of claim 21, comprising using HF and SC-1 solution as cleaning solution in the cleaning process.

23. The method of claim 21, comprising forming the gate oxide film by a wet-type oxidation process and a heat process with a thickness of about 40 Å to about 100 Å.

24. The method of claim 23, comprising performing the wet-type oxidation process at a temperature of about 750° C. to about 800° C. by using hydrogen and oxygen.

25. The method of claim 23, comprising performing the heat process at a temperature of about 800° C. to about 950° C. in a nitrogen gas atmosphere for a duration of about 20 minutes to about 30 minutes.

26. The method of claim 21, comprising depositing the conductive layer with a thickness of more than 700 Å by employing a low pressure chemical vapor deposition method at a temperature of about 510° C. to about 550° C. and a pressure of about 0.1 Torr to about 3 Torr by using silicon source gas.

27. The method of claim 21, comprising forming the NMOS gate electrode while applying ion implantation energy of about 10 KeV to about 30 KeV to n+ ions of about 1E14 ion/cm$^2$ to about 1E16 ion/cm$^2$, and implanting the n+ ions at an inclination angle of 0° to the conductive layer.

28. The method of claim 21, comprising forming the PMOS gate electrode which applies ion implantation energy of about 5 KeV to about 30 KeV to p+ ions of about 1E14 ion/cm² to about 1E16 ion/cm², and implanting the p+ ions at an inclination angle of 0° to the conductive layer.

29. The method of claim 21, wherein the diffusion preventive film is made of WNx and comprising depositing the diffusion preventive film by a sputtering method using W, N₂, and Ar gases with a thickness of about 50 Å to about 100 Å.

30. The method of claim 21, comprising depositing the metal layer using W and Ar gases with a thickness of about 500 Å to about 1000 Å by a sputtering method as an in-situ process with the diffusion preventive film deposition.

31. The method of claim 21, comprising applying ion implantation energy of about 1 KeV to about 10 KeV to the inert ions of about 5E13 ion/cm² to about 5E14 ion/cm², and implanting the inert ions at an inclination angle of about 30° to about 60°, in the inclination ion implantation process.

* * * * *